United States Patent [19]
Suzuki

[11] Patent Number: 5,343,436
[45] Date of Patent: Aug. 30, 1994

[54] ELECTRONIC APPARATUS HAVING BACKUP POWER SOURCE

[75] Inventor: Hidetaka Suzuki, Yokohama, Japan

[73] Assignee: Canon Kabushiki Kaisha, Tokyo, Japan

[21] Appl. No.: 664,226

[22] Filed: Mar. 4, 1991

[30] Foreign Application Priority Data

Mar. 13, 1990 [JP] Japan .................................. 2-59852

[51] Int. Cl.⁵ ............................................. G11C 14/00
[52] U.S. Cl. ..................................... 365/228; 365/229
[58] Field of Search ................................. 365/228, 229

[56] References Cited
FOREIGN PATENT DOCUMENTS 147728 9/1982 Japan .
186612 8/1986 Japan .

Primary Examiner—James B. Mullins
Attorney, Agent, or Firm—Fitzpatrick, Cella, Harper & Scinto

[57] ABSTRACT

An electronic apparatus of the invention uses memory information in each of the first memory area to store the end time of the power supply which was executed from the apparatus main body side to a memory card and the second memory area to store information regarding a residue time of a backup power supply element in the memory card which are provided in a memory element in the memory card and the present time information, thereby actually updating the residue information of the backup power supply element in the memory card. The residue information of the backup power supply element every memory card can be individually accurately managed.

15 Claims, 3 Drawing Sheets

ELECTRONIC APPARATUS HAVING BACKUP POWER SOURCE

BACKGROUND OF THE INVENTION

1. Field of the Invention

The present invention relates to an electronic apparatus and, more particularly, to an electronic apparatus which uses a detachable memory card such as, for example, an external memory device and in which a power source is supplied from the apparatus main body to the memory card for a period of time when the memory card is loaded and, in the case where the memory card is unloaded, the memory content in a memory element of the memory card is backed up by a backup power supply element in the memory card.

2. Related Background Art

Hitherto, an apparatus using a memory card as a memory medium has been known as a portable electronic apparatus, particularly, as a handy terminal, a portable word processor, or a personal computer.

In the case of using a memory card in a conventional portable terminal apparatus, when the memory card is not loaded into the portable terminal apparatus, data in the memory is held by a lithium battery provided in the memory card. When the card is loaded, a power source is supplied from the portable terminal apparatus, thereby preventing the consumption of the electric power of the lithium battery.

However, in the above conventional apparatus, an exchange period of time of the lithium battery is set in correspondence with the memory capacity of the memory card so as not to extinguish the data in the memory card. Since such a period of time is generally set on a unit basis of a half year or one year, there are the following drawbacks.

(1) If the exchange period of time of the lithium battery is set on the assumption that the power source is supplied from the portable terminal apparatus, when the loading time is exceptionally short, there is a fear that data may be extinguished due to a voltage drop of the lithium battery when the exchange period of time is a half year or longer.

(2) On the contrary, if the loading time is long and an electric power consumption of the lithium battery is small, the battery must be exchanged at a time near a predetermined exchange period of time in spite of the fact that there is no need to exchange the battery which still has sufficient capacity, because the apparatus does not have the means for detecting the electric power consumption of the battery. Such an exchange operation is troublesome.

A deviation of the substantial exchange period of time of the lithium battery due to the loading time corresponds to an error of 8 to 25% for the battery exchange period of time when it is assumed that the loading time is one to three hours per day.

Therefore, there is a problem such that if the user erroneously discriminates the exchange period of time of the lithium battery of the memory card, the significant data is extinguished.

SUMMARY OF THE INVENTION

It is the first object of the invention to automatically manage a backup power source of a memory card, thereby preventing the extinguishment of significant data.

It is the second object of the invention to execute a proper residue warning by information regarding a residue time of backup power supply means, thereby effectively using an energy resource and raising an economical efficiency.

DETAILED DESCRIPTION OF THE PREFERRED EMBODIMENT

Figure 1:
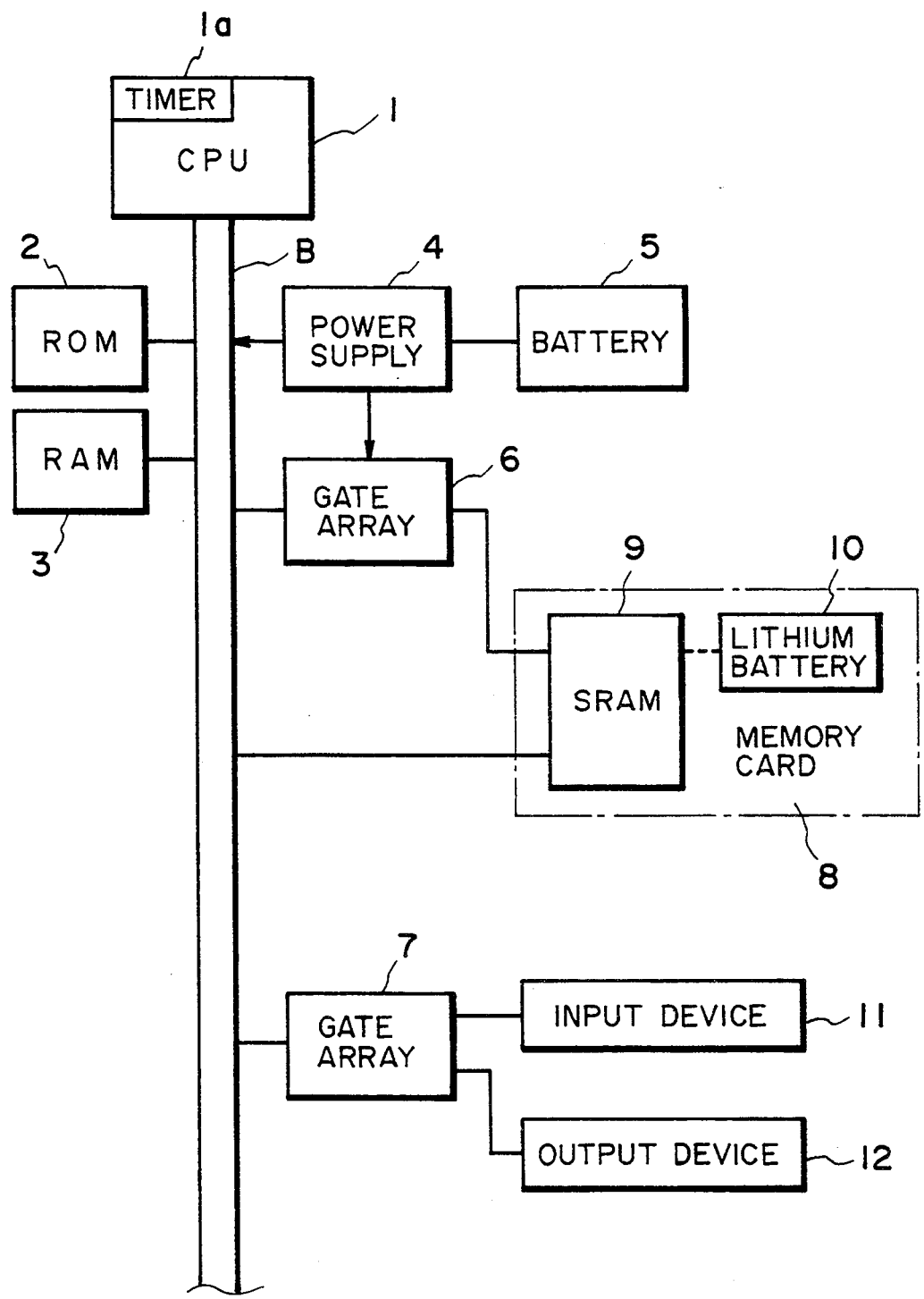
FIG. 1 is a block diagram showing a construction of an electronic apparatus to which the invention was applied.

The invention will be described in detail hereinbelow on the basis of an embodiment shown in the drawings.

FIG. 1 shows a construction of a handy terminal or the like as an example of a portable electronic apparatus to which the invention is applied.

In the diagram, reference numeral 1 denotes a CPU comprising a microprocessor or the like. The following components of the apparatus are connected to a bus B (comprising an address bus, a data bus, and the like).

A ROM 2 is connected to store control programs of the CPU 1. A control procedure, which will be explained hereinlater, is also stored into the ROM 2 as a program for the CPU 1. A RAM 3 is used as a work area upon operation of the apparatus and a work area to execute the control procedure, which will be explained hereinlater, a buffer to input/output, and the like. The apparatus shown in the diagram has an input device 11 and an output device 12. The input and output devices 11 and 12 comprise: operating means such as a keyboard or the like; display means such as an LCD display or the like; a communication line interface; a keyboard; a printer; and other various peripheral apparatuses. The input and output devices 11 and 12 are connected to the data bus B through a gate array 7.

A power source of the apparatus is supplied from a battery 5 and a power supply circuit 4 comprising a circuit to stabilize an output of the battery 5 and the like.

The apparatus shown in the diagram uses a memory card 8 as an external memory device. The memory card 8 has an SRAM (static RAM). In a state in which the memory card 8 is connected to the apparatus, a bus of the memory card 8 is connected to the bus B, thereby executing the input and output operations of data with the apparatus main body by the control through a gate array 6.

On the other hand, when the memory card 8 is connected to the apparatus main body, a power source of the memory card 8 is supplied through the gate array 6. When the memory card 8 is disconnected from the apparatus main body, the content of the SRAM 9 is backed up by a lithium battery 10 built in the memory card 8.

The CPU 1 has therein a timer 1a to count the present time in order to execute the control, which will be explained hereinlater. The timer 1a can be also constructed by an element which is provided separately from the CPU 1.

Figure 2:
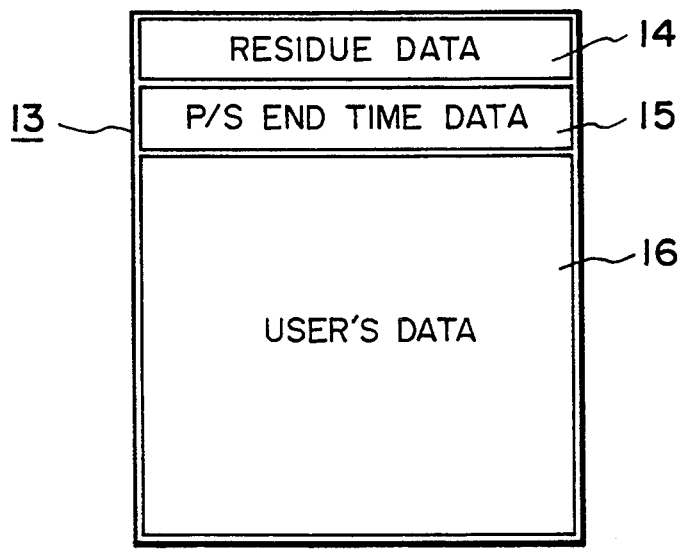
FIG. 2 is an explanatory diagram showing a memory space of a residue data area in a memory card in the apparatus of FIG. 1.

FIG. 2 shows a memory format of the SRAM 9 of the memory card 8 in FIG. 1. In FIG. 2, reference numeral 13 denotes a whole memory area of the SRAM 9. The memory area comprises areas 14 to 16.

Reference numeral 16 denotes the data area to store the user's data in a manner similar to the case of a well-known memory card. In the embodiment, the areas 14 and 15 to manage a residual amount of the lithium battery 10 of the memory card 8 are further provided.

A count number is written into the residue data area 14 on a minute unit basis or the like in accordance with the exchange period of time corresponding to a predetermined battery capacity (such an exchange period of time also changes due to a memory capacity or the like).

The time (hereinafter, referred to as a P/S end time) when the power supply from the apparatus main body to the memory card 8 was stopped during the use of the memory card 8 is written in the P/S end time data area 15.

Therefore, as will be explained hereinlater, when the memory card 8 is loaded, the CPU 1 can know how long the backup of the SRAM 9 was performed by the lithium battery 10 after the memory card had lastly been accessed on the basis of the content of the P/S end time data area 15 and the difference (hereinafter, referred to as a backup time) of the present time which is indicated by the timer 1a in the CPU 1. By calculating the backup time from the content of the residue data area 14, a consuming state of the lithium battery 10 can be known and a residue warning can be executed on the basis of the consuming state.

Figure 3:
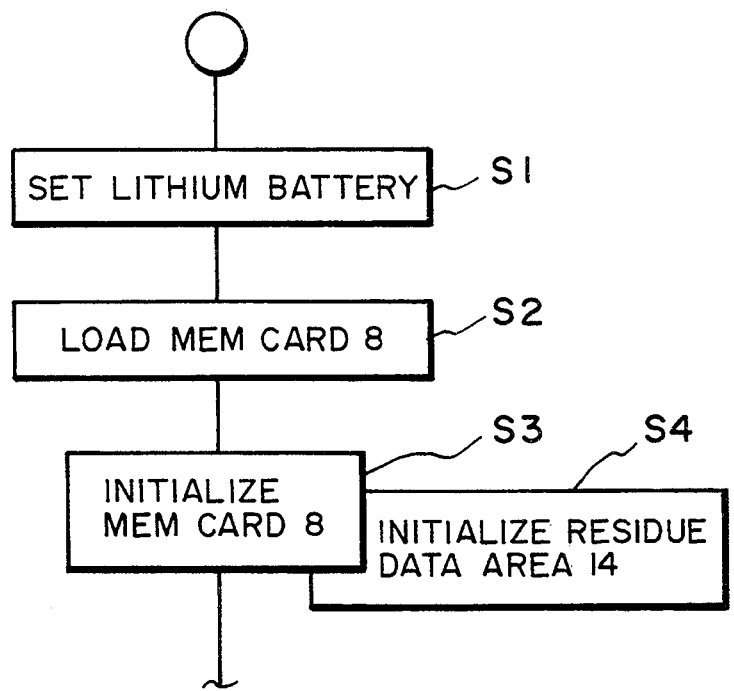
FIG. 3 is a flowchart showing a processing procedure upon initialization in the apparatus of FIG. 1.

FIG. 3 shows a processing procedure when the lithium battery is first set into the memory card and the use of the battery is started. The procedure shown in the diagram is stored in the ROM 2 as a control program of the CPU 1.

In the case where the user sets the lithium battery 10 into the memory card 8 and first uses the memory card 8, the lithium battery 10 is loaded in step S1. Further, the memory card 8 is connected to the main body in step S2.

In step S3, initialization of the memory card such as formatting or the like by the main body side is executed. However, initialization (step S4) of the battery residue data area 14 of the SRAM 9 in the memory card 8 is also executed. In step S4, the count value is written on a minute unit basis or the like in accordance with the exchange period of time corresponding to the capacity of the memory card.

Figure 4:
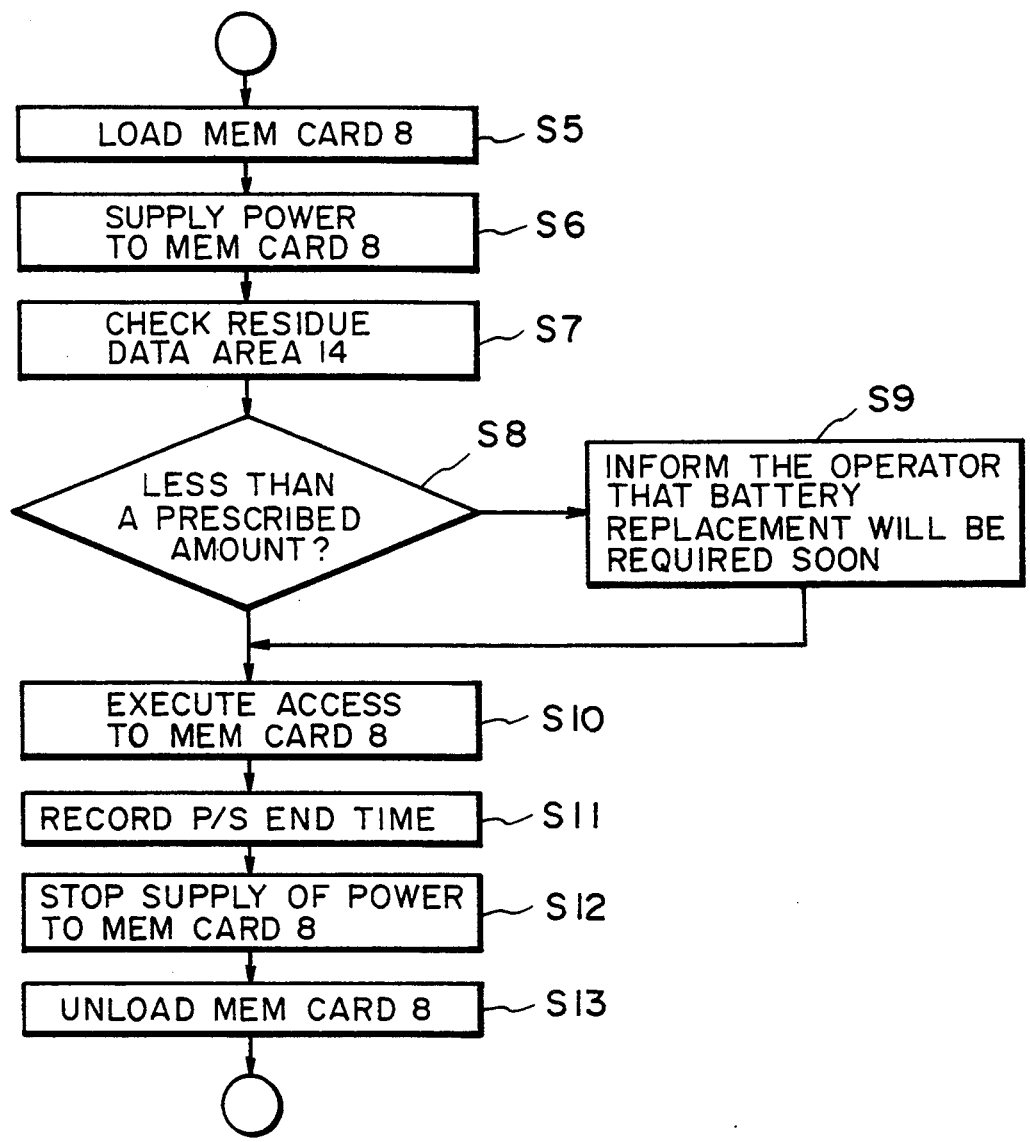
FIG. 4 is a flowchart showing an ordinary processing procedure in the apparatus of FIG. 1.

FIG. 4 is a flowchart for processes during the ordinary use of the memory card 8 after completion of the initialization of FIG. 3.

In step S5, when the initialized memory card 8 is loaded into the main body, the software of a memory card device handler or the like to control the access to the memory card checks a residue of the lithium battery 10 of the memory card 8 on the basis of the content of the residue data area 14 in the SRAM 9.

That is, in step S7, the content of the residue data area 14 is extracted and a difference between the last use end time of the memory card 8 which has been stored in the P/S end time data area 15 and the present time indicated by the timer 1a is calculated as a backup time of the memory card 8 by the residue data area 14. The backup time is subtracted from the residue data in the residue data area 14 and the resultant data is left in the residue data area 14.

In step S8, if the residue value obtained in step S7 is less than a prescribed amount, a message informing that the battery replacement will soon be required is informed in step S9.

In step S10, the ordinary data process using the memory card 8 is executed. When a processing end command (or use stop command of the memory card 8 or the like) is generated from the user, step S11 follows. A count time of the timer 1a at that time is written as a P/S end time into the P/S end time data area 15 of the SRAM 9 in the memory card 8.

In step S12, the power supply to the memory card 8 through the gate array 6 is stopped.

In step S13, the memory card 8 is unloaded from the main body.

Figure 5:
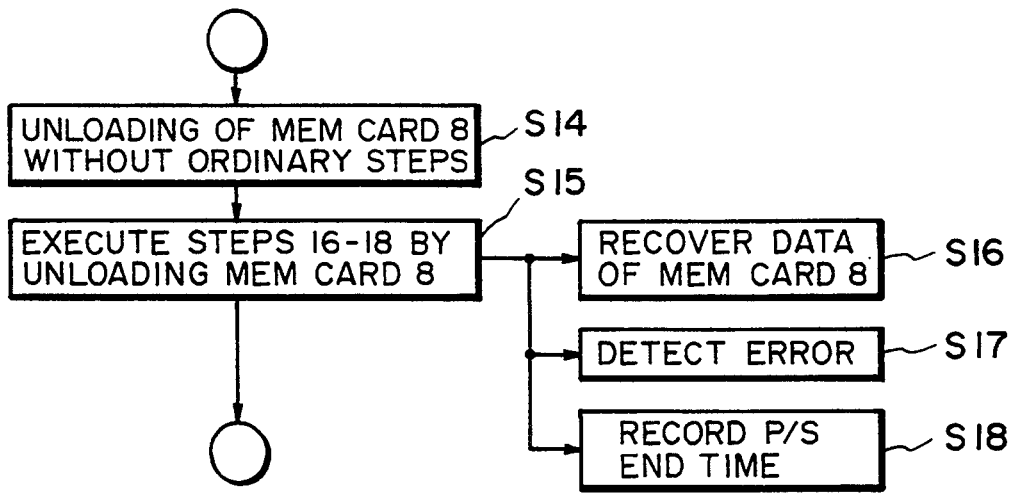
FIG. 5 is a flowchart showing a process when a memory card is unloaded in the apparatus of FIG. 1.

FIG. 5 shows a processing flowchart in the case where the user suddenly unloaded the memory card without executing the finishing processes in step S11 and subsequent steps.

When the user suddenly unloaded the memory card, in step S14, a state of a connector terminal of the memory card 8, a state of a sensor to detect the presence or absence of the memory card 8, and the like change. Therefore, the CPU 1 detects such a change by an interrupting method or the like and executes processes in step S15 and subsequent steps.

It is now assumed that a delay time sufficient to enable processes, which will be explained hereinlater, to be performed is assured for a period of time from a time point of the detection of the unloading of the memory card in step S14 to a time point when the memory card 8 is actually disconnected from the internal circuit of the main body. For instance, the apparatus is constructed in a manner such that after the sensor started the operation, the connector terminal of the memory card 8 is held in a contact state with the connector terminal on the main body side for a little while. Or, a lid or a cover is attached to the memory card loading portion and the opening of the lid or cover is detected by a hardware interruption or the like, so that a delay time can be obtained.

In step S15, a control state is set and changed so as to execute the processes in steps S16, S17, and S18 in accordance with a processing situation. In step S16, the data which is being transferred from the memory card 8 into the SRAM 9 is recovered. In step S17, a logical check such as an error detection or the like of the data which has already been stored in the SRAM 9 or the like and the disconnection are executed.

In step S18, the P/S end time is recorded in a manner similar to step S11 in FIG. 4.

According to the above embodiment, in the apparatus using the memory card 8, the residue data area 14 of the lithium battery 10 to back up the SRAM 9 and the area 15 to store the P/S end time are provided in the SRAM 9 of the memory card 8. Thus, the CPU 1 can accurately recognize the backup time by the lithium battery 10 of the memory card 8 by using the difference between the present time obtained by the timer 1a and the time in the area 15 and the memory content in the area 14.

Therefore, the residue (or exchange period of time) of the lithium battery can be accurately managed and informed to the user for every memory card 8.

Further, by raising the accuracy of the residue, the lithium battery cannot be abandoned in vain. Therefore, the economical performance can be raised.

As a secondary effect, in the case of a using state in which a power supply from the main body side to the memory card 8 is large, a frequency of the exchange of the lithium battery is reduced and the working efficiency can be improved.

On the other hand, as shown in FIG. 5, in the case of a using state in which by executing a proper recovering process and a recording process of the P/S end time in accordance with the loading/unloading state of the memory card 8, for instance, the power source is supplied from the main body side simultaneously with the loading of the memory card 8, that is, the memory card is always accessed, an interruption is generated by each of the opening and closure of the memory card reader/writer, the residue count of the lithium battery, the turn-on of the power supply from the main body, and the end time can be confirmed, respectively.

As will be obviously understood from the above description, according to the invention, there is provided an electronic apparatus in which a detachable memory card is used as an external memory device. A power source is supplied from the apparatus main body to the memory card for a loading period of time of the memory card, and the memory content of a memory element of the memory card is backed up by a backup power supply element in the memory card in the case where the memory card was unloaded. Timer means counts the present time and is provided in the apparatus main body, a first memory area to store the end time of the power supply which was executed from the apparatus main body side to the memory card and a second memory area to store information regarding the residue time of the backup power supply element in the memory card are provided in memory areas of the memory element in the memory card. In the case of using the memory card, a backup time of the memory content by the backup power supply element is obtained from a count value corresponding to a difference between the power supply end time stored in the first memory area and the present time counted by the timer means and is subtracted from the residue time data, thereby updating the residue time data in the second memory area. Therefore, by using the memory information in the first memory area to store the end time of the power supply which was executed from the apparatus main body side to the memory card and the second memory area to store the information regarding the residue time of the backup power supply element in the memory card which are provided in the memory element in the memory card and by using the present time information, the residue information of the backup power supply element in the memory card is actually updated, and there are excellent effects such that the residue information of the backup power supply element can be individually accurately managed every memory card, extinguishment of the data in the memory element in the memory card can be prevented, and by properly warning a residue amount, an energy resource can be effectively used.

What is claimed is:

1. An electronic apparatus comprising:
   timer means for counting a present time;
   power source supplying means for supplying a power source to an external apparatus which is detachably connected;
   means for allowing end time information of the power supplied by the power source supplying means to be stored into a first memory area which belongs to memory means of the external apparatus having the memory means and backup power supply means and for allowing information regarding a residue time of the backup power supply means to be stored into a second memory area which belongs to the memory means of the external apparatus; and
   means for reading out the end time information of the power supplied by the power source supplying means from the first memory area which belongs to the memory means of the external apparatus which is detachably connected, for inputting the present time information by the timer means, for outputting a count value corresponding to a difference between the end of time information and the present time information, and for updating the residue time information for the second memory area to a value which is obtained by subtracting the count value from the residue time information which was read out from the second memory area which belongs to the memory means of the external apparatus.

2. An apparatus according to claim 1, further comprising means for reading out the residue time information from the second memory area which belongs to the memory means of the external apparatus which is detachably connected and for generating a warning to instruct an exchange of the backup power supply means in the case where the residue time information is less than a predetermined value.

3. An electronic apparatus comprising:
   memory means having a first memory area to store an end time of a power source supplied from an apparatus main body and a second memory area to store information regarding a residue time of backup power supply means provided in said apparatus; and
   the backup power supply means for supplying the power source to said memory means for a period of time when no power source is supplied from the apparatus main body to the memory means.

4. An electronic apparatus comprising:
   timer means which belongs to an apparatus main body side and counts a present time;
   power supplying means which belongs to the apparatus main body side and supplies a power source to a detachable external apparatus;
   the detachable external apparatus being capable of being attached to and detached from the apparatus main body side and the detachable external apparatus comprising memory means having first and second memory areas and backup power supply means for supplying a power source to the memory means in a state in which the power source is not supplied from the power supplying means to the memory means;
   means on the apparatus main body side for allowing an end time of the power supplied by the power supplying means to be stored into the first memory area of the memory means which belongs to the external apparatus and for allowing information regarding a residue time o the backup power supply means to be stored into the second memory area of the memory means; and
   means on the apparatus main body side for reading out the end time information of the power supplied by the power supplying means from the first memory area in the external apparatus, for inputting the present time from said timer means, for outputting a count value corresponding to a difference between the end of time information and the present time, and for updating residue time information for the second memory area to a value which is obtained by subtracting the count value from the residue time information which was read out from the second memory area in the external apparatus.

5. An apparatus according to claim 4, further comprising means for reading out the residue time information from the second memory area which belongs to the memory means in the detachable external apparatus and for generating a warning to instruct an exchange of the backup power supply means in the case where the residue time information is less than a predetermined value.

6. An electronic apparatus having a main body provided with power supply means, said apparatus comprising:

first memory means for storing input data;

second memory means for storing information on a switch time at which a power source for an external device is switched from the power supply means of the main body to power supply means provided in the external device each time such a switching occurs; and third memory means for storing information on capacity of the power supply means of the external device, wherein the capacity information is derived from the switch time information stored in said second memory means and information on a current time.

7. An apparatus according to claim 6, wherein said first and second and third memory means are provided in the same memory means.

8. An apparatus according to claim 6, wherein the switch time is a time at which the external device is detached from the main body.

9. An apparatus according to claim 6, wherein said third memory means stores the switch time upon input of an instruction for ending a process executed in said apparatus.

10. An apparatus according to claim 6, wherein the switch time information is stored when a lid or cover provided in said apparatus for the external device is released.

11. An apparatus according to claim 6, wherein the information stored in said second memory means is initialized when the external device is initialized.

12. An electronic apparatus comprising:

first power supply means for supplying power to an external device detachably mountable to said apparatus;

control means for controlling memory means to store information regarding a switch time at which a power source for the external device is switched from said first power supply means to a second power supply means provided in the external device each time such a switching occurs; and obtaining means for obtaining information on capacity of the second power supply means based on the switch time information stored in the memory means and information on a current time measured by timer means.

13. An apparatus according to claim 12, wherein the information stored in the memory means is initialized when the external device is initialized.

14. An apparatus according to claim 12, wherein said obtaining means obtains the information on the capacity of the second power supply means when the external device is mounted to said apparatus.

15. An apparatus according to claim 12, wherein the switch time is a time at which the external device is detached from said apparatus.

* * * * *

UNITED STATES PATENT AND TRADEMARK OFFICE
CERTIFICATE OF CORRECTION

PATENT NO. : 5,343,436
DATED : August 30, 1994
INVENTOR(S) : HIDETAKA SUZUKI

It is certified that error appears in the above-indentified patent and that said Letters Patent is hereby corrected as shown below:

On the title page item [57],

Line 12, "every" should read --in every--.

COLUMN 6

Line 64, "o" should read --of--.

Signed and Sealed this

Thirty-first Day of January, 1995

Attest:

BRUCE LEHMAN

*Attesting Officer*   *Commissioner of Patents and Trademarks*